United States Patent
Wang

(10) Patent No.: US 12,506,037 B2
(45) Date of Patent: Dec. 23, 2025

(54) METHOD OF MANUFACTURING MICROELECTRONIC DEVICES, RELATED DEVICES, SYSTEMS, AND APPARATUS

(71) Applicant: Micron Technology, Inc., Boise, ID (US)

(72) Inventor: Chih Kai Wang, Changhua County (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/487,931

(22) Filed: Oct. 16, 2023

(65) Prior Publication Data

US 2024/0047271 A1 Feb. 8, 2024

Related U.S. Application Data

(62) Division of application No. 16/871,266, filed on May 11, 2020, now Pat. No. 11,817,304.

(60) Provisional application No. 62/955,250, filed on Dec. 30, 2019.

(51) Int. Cl.
*H01L 21/78* (2006.01)
*H01L 21/265* (2006.01)
*H01L 21/268* (2006.01)

(52) U.S. Cl.
CPC .......... *H01L 21/78* (2013.01); *H01L 21/265* (2013.01); *H01L 21/268* (2013.01)

(58) Field of Classification Search
CPC ..... H01L 21/78; H01L 21/265; H01L 21/268; H01L 21/26513; H01L 21/7806
See application file for complete search history.

(56) References Cited

U.S. PATENT DOCUMENTS

| 6,055,460 | A | 4/2000 | Shopbell |
| 6,570,169 | B2 | 5/2003 | Suguro et al. |
| 2006/0046463 | A1* | 3/2006 | Watkins ............ H01L 21/76898 257/E21.597 |
| 2009/0026580 | A1* | 1/2009 | Malachowski ....... H01L 21/302 438/510 |
| 2013/0323909 | A1 | 12/2013 | Wood et al. |

(Continued)

FOREIGN PATENT DOCUMENTS

| CN | 102341890 A | 2/2012 |
| CN | 105590862 A * | 5/2016 |

(Continued)

OTHER PUBLICATIONS

Chinese First Office Action for Chinese Application No. 202011576576.4, dated Sep. 25, 2023, 15 pages with translation.

(Continued)

*Primary Examiner* — Mohammad M Choudhry
(74) *Attorney, Agent, or Firm* — TraskBritt

(57) ABSTRACT

A system and method for stealth dicing a semiconductor wafer. The method may include implanting dopant ions to a first depth in the semiconductor wafer through a back side of the semiconductor wafer. The method may further include focusing a laser beam at an inside portion of the wafer through the back surface of the wafer to form a modified layer in material of the semiconductor wafer proximate the first depth. The method may also include fracturing the semiconductor wafer along boundaries defined by the modified layer.

9 Claims, 9 Drawing Sheets

(56) References Cited

U.S. PATENT DOCUMENTS

| | | | |
|---|---|---|---|
| 2015/0303268 A1* | 10/2015 | Ishimaru | H10D 62/112 |
| | | | 257/608 |
| 2016/0336233 A1 | 11/2016 | Yonehara et al. | |
| 2016/0372541 A1* | 12/2016 | Onozawa | H10D 12/481 |
| 2017/0213908 A1 | 7/2017 | Fursin et al. | |
| 2018/0236597 A1 | 8/2018 | Okuma et al. | |
| 2019/0252364 A1 | 8/2019 | Uzoh et al. | |
| 2020/0211837 A1 | 7/2020 | Espina | |

FOREIGN PATENT DOCUMENTS

| | | | |
|---|---|---|---|
| JP | 2008-147412 A | | 6/2008 |
| TW | 200719431 A | | 5/2007 |
| TW | 201405654 A | | 2/2014 |
| TW | 1479556 | * | 4/2015 |

OTHER PUBLICATIONS

Taiwanese First Office Action for Application No. 1091443988, issued Oct. 29, 2021, 9 pages.

Taiwanese Second Office Action for Application No. 109144388, issued Feb. 11, 2022, 20 pages.

Chinese Notice of Allowance and Supplementary Search Report for Chinese Application No. 202011576576.4, dated Apr. 3, 2024, 8 pages with translation.

* cited by examiner

METHOD OF MANUFACTURING MICROELECTRONIC DEVICES, RELATED DEVICES, SYSTEMS, AND APPARATUS

CROSS REFERENCE TO RELATED APPLICATIONS

This application is a divisional of U.S. patent application Ser. No. 16/871,266, filed May 11, 2020, now U.S. Pat. No. 11,817,304, issued Nov. 14, 2023, which claims the benefit under 35 U.S.C. § 119 (e) of U.S. Provisional Patent Application Ser. No. 62/955,250, filed Dec. 30, 2019, the disclosure of each of which is hereby incorporated herein in its entirety by this reference.

TECHNICAL FIELD

Embodiments of the disclosure relate to a method of fabricating microelectronic devices. Specifically, some embodiments relate to methods of separating wafers into microelectronic devices, and to related devices, electronic systems and apparatus.

BACKGROUND

Microelectronic devices (e.g., semiconductor dice) may be fabricated by selective deposition, removal and treatment of conductive, semiconductive and insulating materials on and over an active surface of a wafer. Hundreds or even thousands of microelectronic devices may be fabricated in an array of rows and columns of microelectronic device locations on a single wafer. After the microelectronic devices are fabricated on the wafer the wafer may be separated, also characterized as "singulated" into individual microelectronic devices along scribe lines (e.g., streets) defined between the individual microelectronic device locations.

Microelectronic devices are commonly used in consumer electronics such as cell phones, tablets, computers, laptops, etc., as well as in servers and in automotive and industrial applications. As consumer electronics manufacturers continue to produce smaller and thinner versions of the consumer electronics while demanding greater performance and enhanced circuit density, the microelectronic devices have become smaller and thinner to accommodate these requirements. However, as microelectronic devices have become smaller and thinner, irregularities introduced at and near the edges of the microelectronic devices along the scribe lines during the separation process have become a significant issue in terms of yield and mortality. This problem arises in part due to the introduction of low k (k≈1) dielectric materials to enhance scaling of integrated circuitry as conductors and components have become smaller, thinner and ever-closer to one another. Conventional insulating dielectrics such as silicon dioxide cannot be sufficiently thin without charge buildup and crosstalk. On the other hand, low k dielectrics of desirable thinness reduce parasitic capacitance, eliminate crosstalk and enable faster switching speeds. However, polymeric low-k dielectrics commonly employed, such as polyimides, polynorbornenes, benzocyclobutene (BCB) and polytetrafluoroethylene (PTFE) suffer from low mechanical strength, coefficient of thermal expansion (CTE) mismatch with other materials of the microelectronic device, and lack of thermal stability. Accordingly, it is desirable to implement new processes for singulation of microelectronic devices addressing the foregoing concerns.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1A:
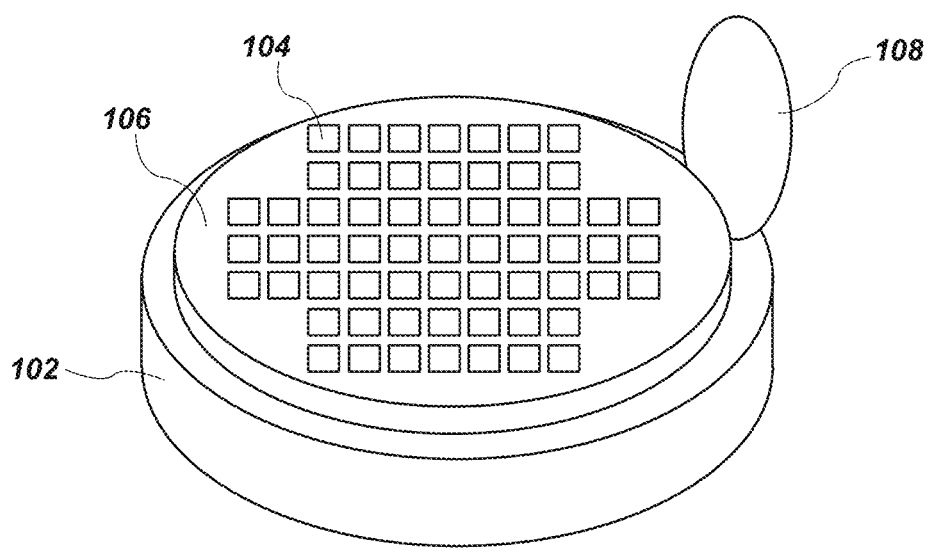
FIGS. 1A and 1B are schematic views of a conventional semiconductor wafer edge trim process.
Figure 1B:
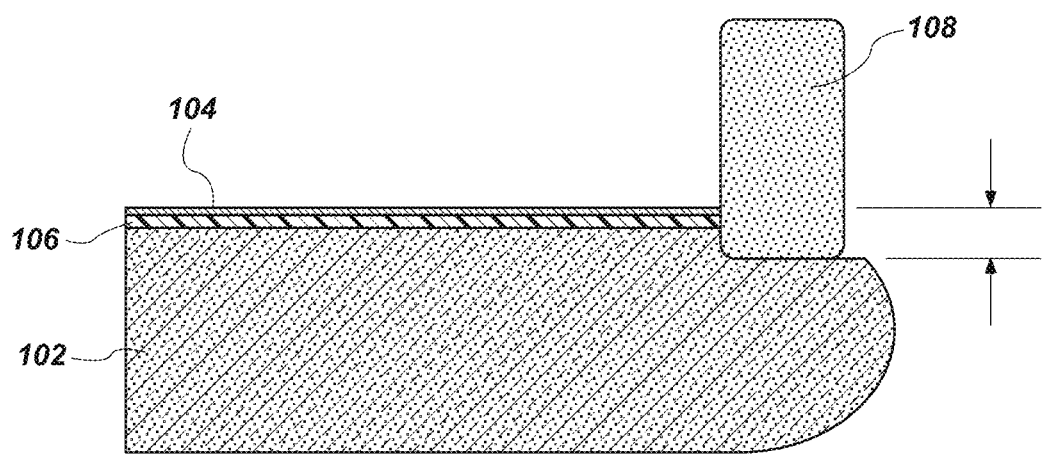

The illustrations presented herein are not meant to be actual views of any particular microelectronic device manufacturing operation or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

Microelectronic devices in the form of semiconductor dice are conventionally fabricated on wafers of semiconductor material, most commonly silicon. The microelectronic devices may be manufactured by selective deposition, removal and treatment of conductive, semiconductive and insulating materials on and over an active surface of a wafer in a repeating pattern corresponding to locations for the microelectronic devices. For example, a microelectronic device may include multiple layers of such materials in predetermined patterns forming integrated circuitry on the active surface. In some embodiments, portions of the integrated circuitry may be formed in the active surface, such as source/drain regions, shallow trench isolation (STI), etc. After circuitry for the microelectronic devices is completed, the wafer may be thinned by removing material from a back side of the wafer opposite the active surface, and the wafer may then be separated, or "singulated," into individual microelectronic devices through a dicing process.

As microelectronic devices and material layers thereof become thinner and more fragile, new methods and tooling may be required to successfully thin and singulate the wafers without damaging the individual microelectronic devices. For example, singulation processes that leave a rough finishing edge such as laser groove dicing may result in reduced microelectronic device yield and quality, due to irregularities in the finishing edge of a singulated device, which irregularities may propagate into the device. One process that may be used to separate the microelectronic devices from the wafer without producing rough finishing edges is a so-called Stealth Dice Before Grind (SDBG) process.

A conventional SDBG process may include focusing a laser beam in an interior portion of a wafer during the SDBG process to form a weakened region (e.g., modified layer) of the wafer that may propagate into controlled cracks along paths where the wafer may be separated into separate microelectronic devices. In some embodiments, some of the energy from the laser beam may travel undesirably beyond the weakened region. For example, some of the energy of the laser beam may not be absorbed by the wafer in the weakened region. The energy that is not absorbed may continue to travel through the wafer. The energy may contact integrated circuitry of the microelectronic devices on the active surface of the wafer. In some embodiments, the energy may be sufficient to cause defects in the integrated circuitry, such as material delaminations, melted connections, damaged component regions, etc. Unfortunately, such defects caused by the residual energy may be difficult to detect. For example, defects may not be discovered until final testing in the form of burn-in and characterization of the microelectronic devices. In some instances, the defects may compromise integrity of components and connections within the microelectronic devices to an extent such that the microelectronic devices pass final testing, but experience premature failures (i.e., "infant mortality") when in operation after assembly into an electronic system with other components.

Some embodiments of the present disclosure may include stealth dicing method. The method may include implanting dopant ions to a first depth in a semiconductor wafer through a back surface thereof. The method may further include focusing a laser beam on an inside portion of the semiconductor wafer through the back surface thereof to form a modified layer at a depth from the back surface of the semiconductor wafer less than the first depth. The method may also include fracturing the wafer along boundaries defined by the modified layer.

Some embodiments of the present disclosure may include a system for performing a stealth dicing process. The system may include a doping apparatus configured to implant dopant ions to a first depth in an interior of a semiconductor wafer. The system may further include a laser configured to focus a laser beam at a second depth less than the first depth in an interior portion of the wafer and form a weakened region in material of a semiconductor wafer. The system may also include a material removal tool configured to remove material from the semiconductor wafer to at least the second depth. The doping apparatus, the laser and the material removal tool may each be positioned, in operation, on a same, back side of an in-process semiconductor wafer.

FIGS. 1A-9 illustrate individual steps of an SDBG process. FIG. 1A is a schematic depicting a conventional edge trim process employed prior to an SDBG process, wherein a peripheral edge of an unthinned semiconductor (e.g., silicon) wafer 102 of, for example, a thickness of about 600 μm to about 750 μm and having integrated circuitry layers 104 on an active surface 106 thereof is trimmed in a so-called "edge trim" process using a blade 108 to a depth approximating a final, reduced thickness of wafer 102 plus a selected margin. FIG. 1B is an enlarged schematic cross-sectional view of a portion of wafer 102 being trimmed by blade 108.

Figure 2:
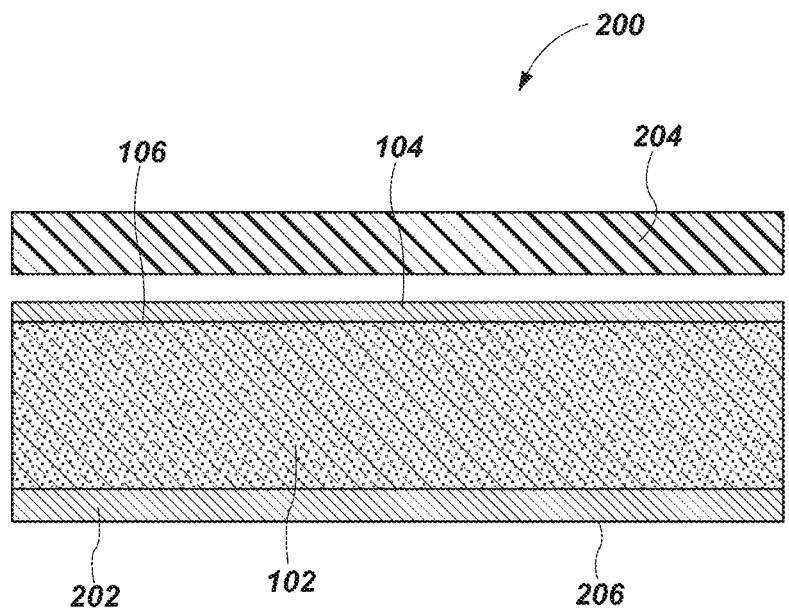
FIG. 2 illustrates a schematic view of a portion of a conventional microelectronic device fabrication sequence after edge trim and in accordance with an embodiment of the present disclosure.

FIG. 2 illustrates a tape lamination process 200. A wafer 102 edge trimmed in accordance with FIGS. 1A and 1B may have circuitry layers 104 formed in an array of microelectronic device locations on an active surface 106 of the wafer 102. For simplicity of illustration, the edge of the full-thickness wafer 102 laterally beyond the microelectronic device locations has been omitted. Once the integrated circuitry layers 104 are formed over the wafer 102, a protective tape 204 may be applied over the integrated circuitry layers 104 in the tape lamination process 200. The protective tape 204 may be configured to protect the circuitry layers 104 of wafer 102 during the subsequent processing, including removal of semiconductor material from back side 206 of semiconductor wafer 102. The back side 206 of the wafer 102 may include an oxidation layer 202. In some embodiments, the oxidation layer 202 may be configured as a cover layer to protect the wafer 102.

Figure 3:
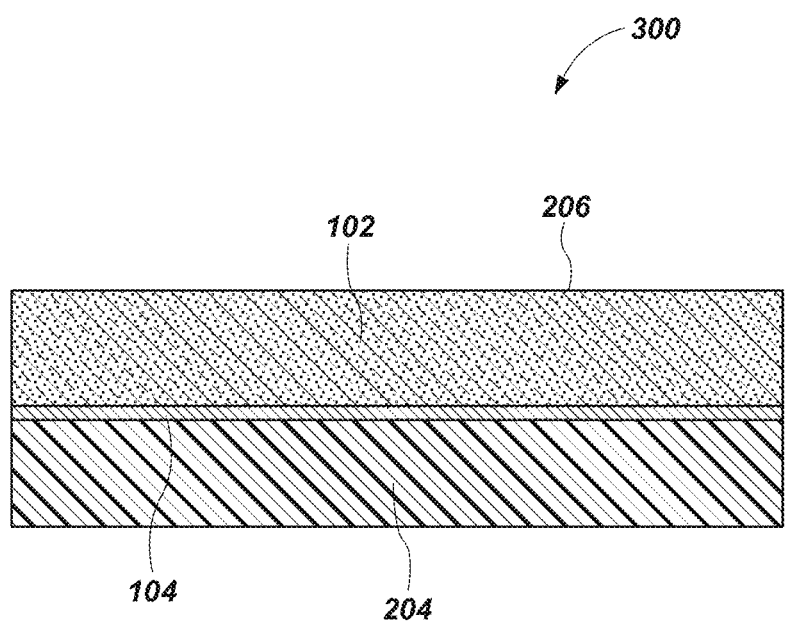
FIG. 3 illustrates a schematic view of a portion of a conventional microelectronic device fabrication sequence after edge trim and in accordance with an embodiment of the present disclosure.

FIG. 3 illustrates a pre-thin process 300. Once the protective tape 204 is applied over the integrated circuitry layers 104, the wafer 102 may be inverted such that a back side 206 of the wafer 102 is facing upward. In the pre-thin process 300 a portion of the wafer 102 such as the oxidation layer 202 (FIG. 2) on the exposed back side 206 may be removed to facilitate penetration of a laser beam into the wafer 102. After the pre-thin process 300, the wafer 102 may remain substantially thicker than a desired final thickness. For example, the pre-thin process 300 may thin the wafer 102 to between about 100 µm and about 300 µm, such as between about 200 µm and about 300 µm. In some embodiments, the pre-thin process 300 may thin the wafer 102 to substantially a final thickness. For example, the wafer 102 may be thinned to between about 50 µm and about 300 µm, such as between about 50 µm and about 200 µm, or between about 50 µm and about 100 µm. The pre-thin process 300 may include a wet etch or polishing process to remove the oxidized portion of material from the back side 206 of the wafer 102.

Figure 4:
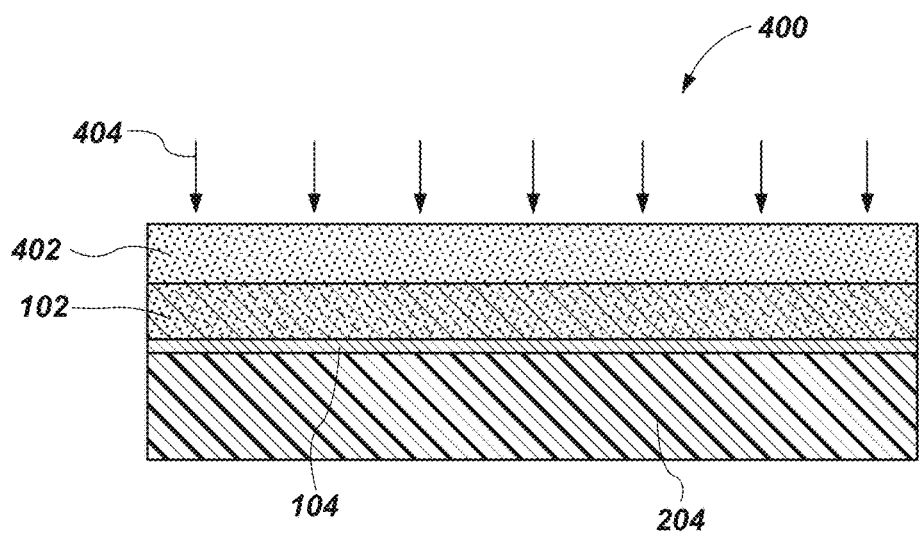
FIG. 4 illustrates a schematic view of a portion of a conventional microelectronic device fabrication sequence after edge trim and in accordance with an embodiment of the present disclosure.

FIG. 4 illustrates an implantation process 400 (e.g., doping process). In the implantation process 400, point defects may be formed within the wafer 102. The point defects may cause dislocations within the wafer 102 that may remain after the point defects are substantially recovered through a subsequent annealing process discussed in detail below. In the implantation process 400, dopant ions 404 may be implanted into the wafer 102 causing point defects such as vacancies and/or interstitial defects in the lattice of the wafer (e.g., in the Si lattice of the wafer). The dopant may be an n-type dopant or a p-type dopant, such as boron, phosphorous, gallium, arsenic, indium, aluminum, antimony, bismuth, lithium, etc.

The dopant ions 404 may be accelerated toward the back side 206 of the wafer 102. The dopant ions 404 may enter the wafer 102 through the back side 206 of the wafer 102. The energy at which the dopant ions 404 are accelerated toward the back side 206 of the wafer 102 may affect a depth of penetration of the dopant ions 404. For example, the dopant ions 404 may form an implantation zone 402 in the wafer 102. The implantation zone 402 may be formed between the back side 206 of the wafer 102 and the active surface 106. The depth of penetration of the dopant ions 404 may affect the depth of the implantation zone 402 measured from the back side 206 of the wafer 102. The dopant ions 404 may have energies greater than about 10 kiloelectronvolts (keV), such as between about 10 keV and about 1000 keV or between about 50 keV and about 500 keV. The depth of penetration of the dopant ions 404 may be up to about 150 µm, such as between about 0 µm and about 150 µm, or between about 50 µm and about 100 µm. In some embodiments, the dopant ion 404 concentration may substantially follow a Gaussian distribution, such that some dopant ions 404 may incidentally penetrate beyond the implantation zone 402 at a lower concentration.

A concentration of dopant ions 404 within the implantation zone 402 may increase the absorption properties of the wafer 102 in the implantation zone 402. For example, the permittivity (ε) of the wafer 102 may be represented by the following formula:

$$\varepsilon(\omega)=\varepsilon_0+4\pi\chi_c=n^2-k^2$$

In the above formula for permittivity (ε), n may be a constant related to the refractive index of the wafer material. In the above formula, k may represent an extinction coefficient (e.g., damping factor). As illustrated in the formula above the extinction coefficient may be directly related to the permittivity (ε). For example, because n is a constant value an increase in the extinction coefficient may result in a decrease in the permittivity (ε), which may represent an increase in the absorption. The formula above also illustrates that the permittivity (ε) may be directly related to $\chi_c$, which may represent an electric susceptibility. The electric susceptibility may be represented by the following formula:

$$\chi_c = \frac{-Ne^2}{\omega^2 m_s}$$

In the above formula, N may represent the carrier concentration (e.g., the concentration of dopant ions 404 or dislocations in the wafer 102); ω may represent a frequency of the energy passing through the wafer 102, such as from the laser beam; and $m_s$ may represent an effective mass of the wafer 102. As illustrated by the above formula an increase in the carrier concentration may result in reduction in the electric susceptibility. The previous formulas also illustrate that a decrease in the electric susceptibility may result in a reduction in the permittivity, which represents an increase in the absorption of the wafer 102. Increasing the absorption of the wafer 102 may enable the wafer 102 to absorb more energy from the laser beam, substantially decreasing the amount of energy from the laser beam that passes through the wafer 102 without being absorbed by the wafer 102.

Figure 5:
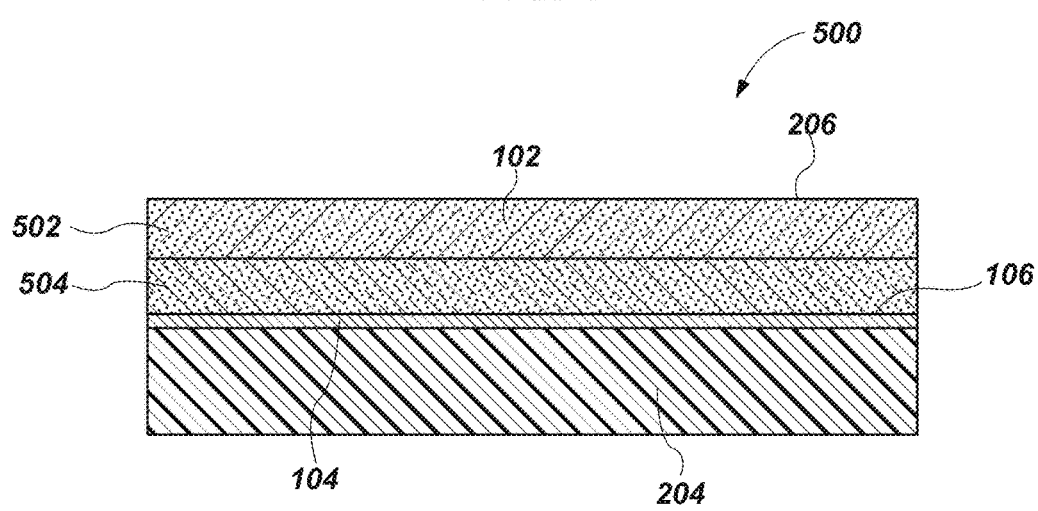
FIG. 5 illustrates a schematic view of a portion of a conventional microelectronic device fabrication sequence after edge trim and in accordance with an embodiment of the present disclosure.

FIG. 5 illustrates an annealing process 500. As discussed above, the implantation process 400 may result in multiple point defects in the wafer 102. The point defects may reduce a mechanical strength of the wafer 102. The point defects may be substantially recovered (i.e., healed) through the annealing process 500. The annealing process 500 may include heating the wafer 102 to a temperature significantly above ambient (i.e., about 25° C.) and maintaining the high temperature for a period of time. For example, the temperature of the wafer 102 may be raised to between about 100° C. and about 300° C. In some embodiments, the annealing process 500 may be completed in a furnace or oven. The annealing process 500 may take an hour or more in a furnace, such as between about 1 hour to about 3 hours. In some embodiments, the annealing process 500 may be completed through a process such as Rapid Thermal Anneal (RTA) or Rapid Thermal Processing (RTP), which may complete the annealing process 500 in less than an hour, such as between about 1 minute and about 30 minutes.

While the point defects may be substantially recovered, dislocations and the carriers (e.g., dopant ions) may remain. As discussed above, the concentration of carriers may affect the absorption properties of the wafer 102. Thus, after the annealing process 500 the wafer 102 may include a first absorption zone 502 and a second absorption zone 504. The first absorption zone 502 may correspond to the implantation zone 402 (FIG. 4). The first absorption zone 502 may have a higher concentration of carriers than the second absorption zone 504 due to the implantation process 400 discussed above. Thus, the first absorption zone 502 may have higher absorption properties than the second absorption zone 504.

Figure 6:
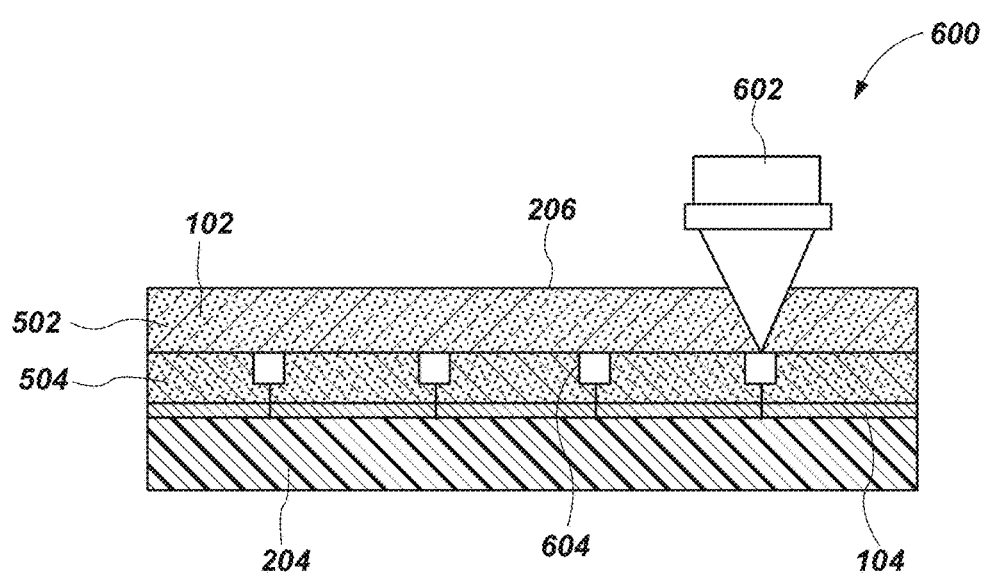
FIG. 6 illustrates a schematic view of a portion of a conventional microelectronic device fabrication sequence after edge trim and in accordance with an embodiment of the present disclosure.
Figure 7:
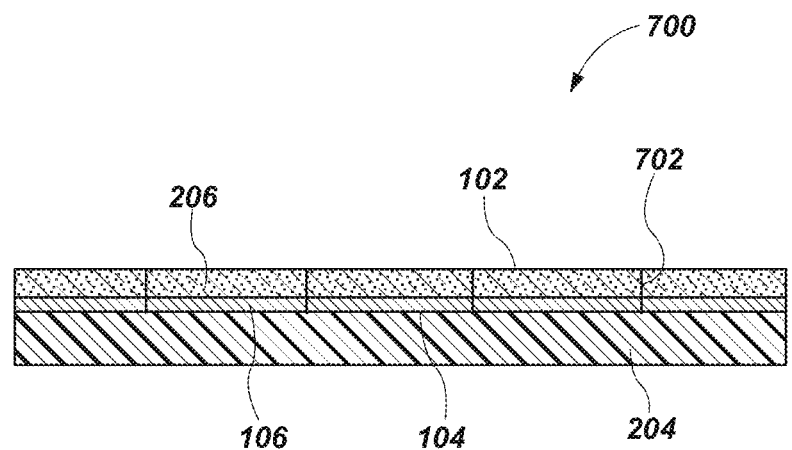
FIG. 7 illustrates a schematic view of a portion of a conventional microelectronic device fabrication sequence after edge trim and in accordance with an embodiment of the present disclosure.

FIG. 6 illustrates an SDBG process 600 being performed on the wafer 102. The SDBG process 600 may include use of a laser beam 602 that is focused on an inner portion of the wafer 102. The laser beam 602 may enter the wafer 102 from the back side 206 of the wafer 102. The laser beam 602 may form, at its focal point, a modified layer 604 inside the wafer 102 comprising weakened regions within the wafer 102. For example, the modified layer 604 may be formed through a localized melting of the material of the body of wafer 102 by the laser beam 602, which changes the crystalline structure of the wafer 102 at that location. The laser beam 602 may be scanned in a pattern corresponding with scribe lines corresponding to separation locations between adjacent microelectronic devices that may be defined in the circuitry layers 104.

The focal point of the laser beam 602 may be at a depth within the wafer 102 measured from the back side 206 of the wafer 102 of between about 50 μm and about 200 μm, such as between about 100 μm and about 150 μm. In some embodiments, the laser beam 602 may pass over the same region of the wafer 102 multiple times at different depths, such that the laser beam 602 forms multiple modified layers 604 at different depths from the back side 206 of wafer 102. In some embodiments, the laser beam 602 may only pass over each region of the wafer 102 one time forming a single modified layer 604 at a single depth.

As described above, the wafer 102 may have a first absorption zone 502 and a second absorption zone 504. The first absorption zone 502 may be the region of the wafer 102 closest to the back side 206 of the wafer 102. Thus, the laser beam 602 may pass through the first absorption zone 502 before entering the second absorption zone 504. In some embodiments, the laser beam 602 may be configured and focused to form the modified layer 604 within the first absorption zone 502, such that the laser beam 602 does not enter the second absorption zone 504. As described above, the first absorption zone 502 may have higher absorption properties than the second absorption zone 504. The higher absorption properties of the first absorption zone 502 may substantially absorb all of the energy from the laser beam 602.

In some embodiments, the laser beam 602 may be focused in the second absorption zone 504. The first absorption zone 502 may be configured to absorb excess energy from the laser beam 602 such that the attenuated laser beam 602 focused in the modified layer 604 within the second absorption zone 504 does not include excess energy beyond what can be absorbed by the material of the wafer 102 in the second absorption zone 504.

After the SDBG process 600, the back side 206 of the wafer 102 may be further thinned to a desired thickness in a thinning process 700. The back side 206 of the wafer 102 may be thinned through a grinding process, optionally followed by a polishing process (i.e., chemical mechanical polishing (CMP)) or a wet etch, to a thickness of, for example, between about 30 μm and about 50 μm. As the wafer 102 is thinned, the modified layer 604 may introduce controlled cracks 702 in the wafer 102 and between circuitry layers 104 of the microelectronic device locations responsive to applied force of the grinding process and associated vibrations in the material of the semiconductor wafer 102. The cracks 702 may originate in the modified layer 604 and extend substantially through the semiconductor wafer 102 into and through the active surface 106 along locations between the integrated circuitry layers 104 of the respective microelectronic device locations.

In some embodiments, the thinning process 700 may substantially remove the material of the wafer 102 in the first absorption zone 502 (FIG. 5), which may coincide with the implantation zone 402 (FIG. 4) as discussed above. Thus, the thinning process 700 may substantially remove any dislocations and/or point defects in the first absorption zone 502 that were not resolved in the annealing process 500. As discussed above, some of the implanted dopant ions 404 may travel beyond the implantation zone 402 (FIG. 4) due to the substantially Gaussian distribution of the dopant ion 404 concentration. The dopant ions 404 that travel beyond the implantation zone 402 may cause dislocations and/or carrier concentrations within the second absorption zone 504. The dislocations and/or carrier concentrations in the second absorption zone 504 may remain in the wafer 102 after the thinning process, resulting in the wafer 102 including a higher concentration of dislocations and/or carrier concentrations than the intrinsic levels present in standard silicon wafers. The concentration of dislocations and/or carrier concentrations in the second absorption zone 504 may be substantially less than the concentrations in the first absorption zone 502, such that any changes to the properties of the wafer 102 such as reductions in strength and/or increases in conductivity of the wafer 102 may be substantially minimized by removal of the first absorption zone 502.

In some embodiments, the changes to the properties of the wafer 102 due to the dislocations and/or carrier concentrations may be desirable. Thus, in some embodiments, the thinning process 700 may not remove the entire first absorption zone 502. In some embodiments, the wafer 102 may not be thinned in the thinning process 700. For example, the wafer 102 may be thinned to the desired thickness in the pre-thin process 300. The cracks 702 may form from the modified layer 604 through residual stresses in the wafer 102 rather than through the thinning process 700. For example, as discussed above, multiple modified layers 604 may be formed, such that residual stresses may extend the cracks 702 through a relatively thicker, although pre-thinned, wafer 102. In some embodiments, the wafer 102 may be thinned through the pre-thin process 300 to a smaller thickness, such as between about 50 μm and about 100 μm, such that the residual stresses are sufficient to carry the cracks 702 through the wafer 102 without further thinning the wafer 102 in the thinning process 700. In some embodiments, the higher carrier concentrations and/or dislocations in the first absorption zone 502 of the 102 nearest the back side 206 of the wafer 102 may reduce the strength of the wafer 102 in the first absorption zone 502. The reduced strength of the wafer 102 may enable the cracks 702 to extend a greater distance through the first absorption zone 502, enabling the cracks 702 to form through a wafer 102 having a greater relative thickness.

Figure 8:
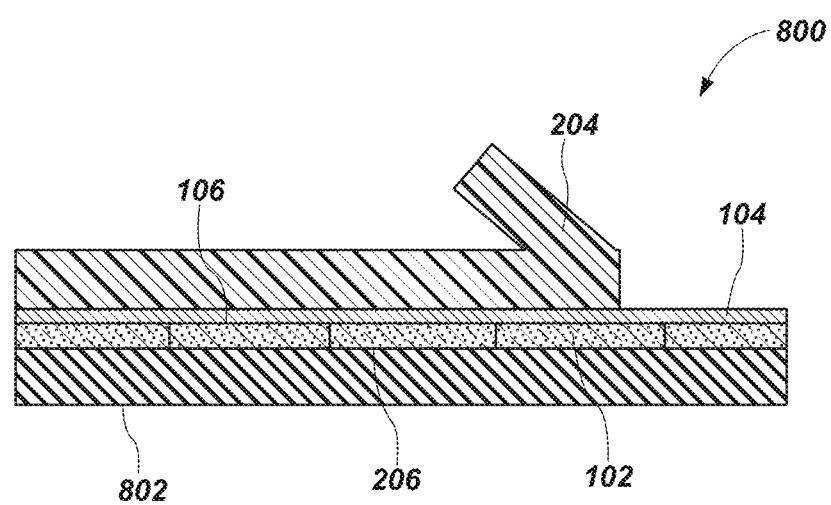
FIG. 8 illustrates a schematic view of a portion of a conventional microelectronic device fabrication sequence after edge trim and in accordance with an embodiment of the present disclosure.

FIG. 8 illustrates a tape peeling process 800. After the cracks 702 have formed in the wafer 102, the wafer 102 may be inverted such that the active surface 106 is facing upward. The back side 206 of the wafer 102 may be mounted to a die attach film 802 and the protective tape 204 may be removed (i.e., peeled) from the integrated circuitry layers 104 in a mounting and tape peeling process 800.

Figure 9:
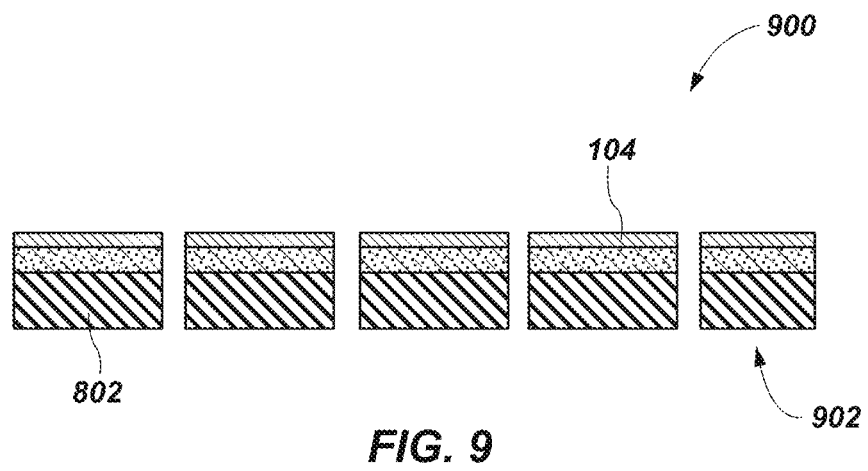
FIG. 9 illustrates a schematic view of a portion of a conventional microelectronic device fabrication sequence after edge trim and in accordance with an embodiment of the present disclosure.

After the mounting and tape peeling process 800, the semiconductor wafer 102 may be separated into individual microelectronic devices 902 in a singulation process 900, as depicted in FIG. 9. In the singulation process 900 the die attach film 802 carrying semiconductor wafer 102 may be mounted to a table or chuck that may be configured to apply a radially directed force to the wafer 102 such that the individual microelectronic devices 902 separate along the cracks 702 formed through the SDBG process. In some embodiments, the table or chuck may be configured to cool the wafer 102 to a temperature wherein dielectric materials of the microelectronic devices 902 sever cleanly and without tearing or smearing.

Figure 10A:
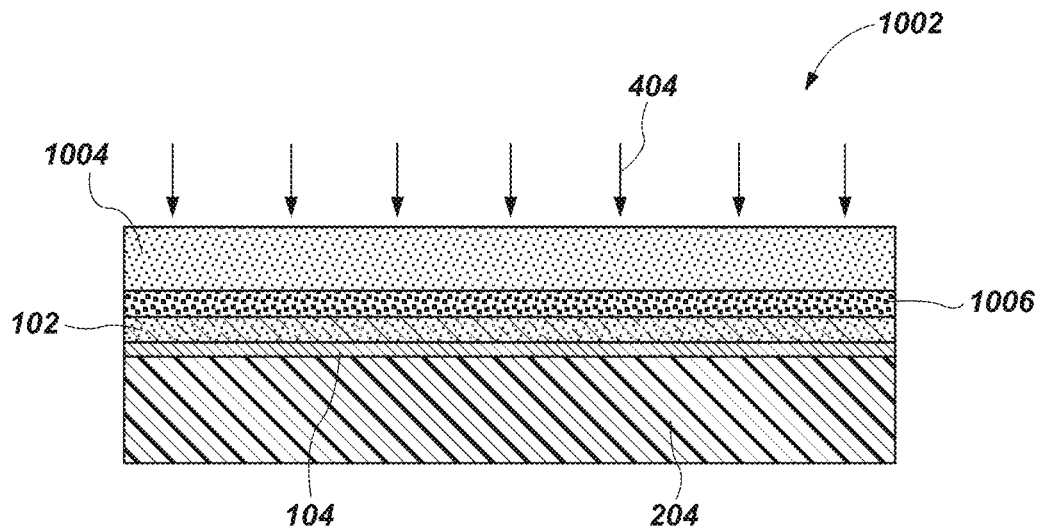
FIG. 10A illustrates a schematic view of a portion of a conventional microelectronic device fabrication sequence after edge trim and in accordance with an embodiment of the present disclosure.
Figure 10B:
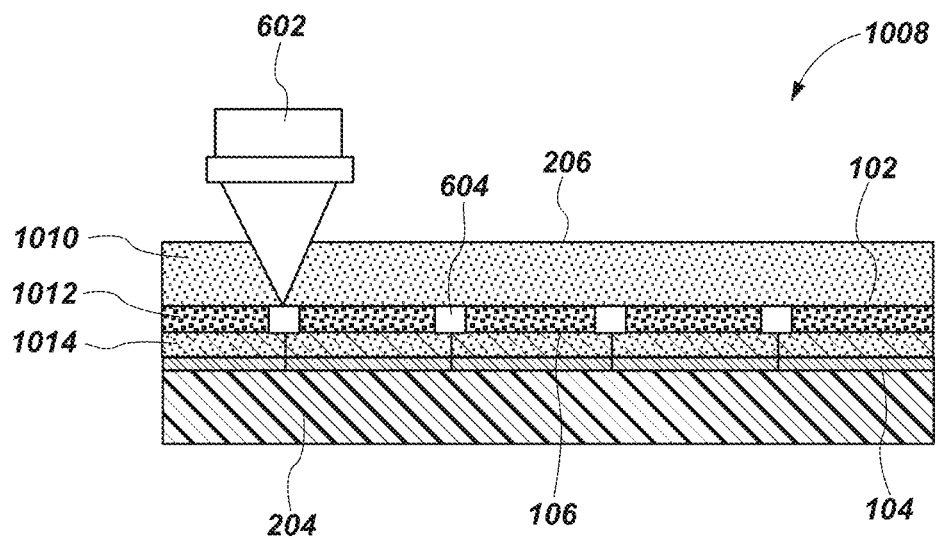
FIG. 10B illustrates a schematic view of a portion of a conventional microelectronic device fabrication sequence after edge trim and in accordance with an embodiment of the present disclosure.

In some embodiments, the dopant ions 404 may be implanted at multiple different energies. FIG. 10A and FIG. 10B illustrate an implantation process 1002 involving multiple different energies and an SDBG process 1008 on an embodiment of the wafer 102 resulting from the implantation process 1002.

The implantation process 1002 may include implanting dopant ions 404 at different energies. As described above, the energy of the dopant ions 404 may dictate the distance that the dopant ions 404 travel within the wafer 102. Dopant ions 404 implanted at a higher energy may travel to a greater depth within the wafer 102 than dopant ions 404 implanted at a lower energy. Thus, a depth of the penetration of the dopant ions 404 may be controlled by controlling the energy at which the dopant ions 404 are implanted. FIG. 10A illustrates an implantation process 1002 featuring a first implantation zone 1004 and a second implantation zone 1006. The first implantation zone 1004 and the second implantation zone 1006 may, optionally, be characterized by different carrier concentrations. The dopant ions 404 may be accelerated to two different implantation energy ranges. For example, some dopant ions 404 may be accelerated to a higher implantation energy range such that the dopant ions 404 travel through the first implantation zone 1004 to the second implantation zone 1006. Another set of dopant ions 404 may be accelerated to a lower implantation energy range such that the dopant ions 404 travel only to the first implantation zone 1004. In some embodiments, the implantation process 1002 may create additional implantation zones, such as a third implantation zone, a fourth implantation zone, etc., each of which may be characterized by different carrier concentrations.

The carrier concentration of the first implantation zone 1004 and the second implantation zone 1006 may be controlled by controlling the number of dopant ions 404 accelerated to the specified energy ranges. For example, a relatively larger number of dopant ions 404 may be accelerated to a higher implantation energy range such that the relatively larger number of dopant ions 404 travels to the second implantation zone 1006. A relatively smaller number of dopant ions 404 may be accelerated to a lower implantation energy range such that the relatively smaller number of dopant ions 404 stops traveling in the first implantation zone 1004 before reaching the second implantation zone 1006. Thus, the second implantation zone 1006 may have a greater carrier concentration than the first implantation zone 1004. In some embodiments, the number of dopant ions 404 implanted with each implantation energy range may be controlled by controlling an amount of time that the dopant is exposed to the different implantation energy levels. In some embodiments, the number of dopant ions 404 in each implantation energy range may be controlled by controlling the amount of dopant used.

As described above, the wafer 102 may go through an annealing process to resolve point defects caused during the implantation process 1002. FIG. 10B illustrates the wafer 102 after the annealing process during an SDBG process 1008. The annealing process may form a first absorption zone 1010, a second absorption zone 1012, and a third absorption zone 1014 respectively from first implantation zone 1004, the second implantation zone 1006, and the end thickness of wafer 102, which is substantially free from implanted dopant ions. In some embodiments, the laser beam 602 may be focused within the second absorption zone 1012, such that the modified layer 604 may be formed within the second absorption zone 1012.

In some embodiments, the implantation process 1002 may be controlled such that the second absorption zone 1012 may have a higher concentration of carriers than either the first absorption zone 1010 or the third absorption zone 1014. For example, the highest carrier concentration may be in the second absorption zone 1012, the lowest carrier concentration may be in the third absorption zone 1014, and the first absorption zone 1010 may have an intermediate carrier concentration. Accordingly, the second absorption zone 1012 may also exhibit the highest absorption properties and the third absorption zone 1014 may exhibit the lowest absorption properties. The carrier concentration of the first absorption zone 1010 and the second absorption zone 1012 may be configured, in combination, to substantially completely absorb the energy from the laser beam 602.

In some embodiments, the carrier concentration may be configured such that a minimal amount of the energy of the laser beam 602 is absorbed as the laser beam 602 travels through the first absorption zone 1010. Substantially the entire energy of the laser beam 602 may then be concentrated in the modified layer 604 within the second absorption zone 1012. The high carrier concentration in the second absorption zone 1012 may enable the second absorption zone 1012 to substantially absorb the energy of the laser beam 602 focused in the modified layer 604, such that the energy of the laser beam 602 does not pass through the second absorption zone 1012 to the third absorption zone 1014.

Some embodiments of the present disclosure may include a method. The method may include forming an array of microelectronic devices comprising integrated circuitry on a first surface of a semiconductor wafer. The method may further include thinning the semiconductor wafer from a second, opposing surface. The method may also include implanting dopant ions into an interior portion of the thinned semiconductor wafer through the second surface. The method may further include annealing the semiconductor wafer after implanting the dopant ions. The method may also include forming a modified layer along a separation region extending between adjacent microelectronic device by focusing a laser beam through the second surface and into an interior portion of the wafer comprising implanted dopant ions. The method may further include separating the semiconductor wafer along the separation region to form separate microelectronic devices.

Other embodiments of the present disclosure may include a method. The method may include implanting dopant ions into a semiconductor wafer from a back side thereof opposite an active surface thereof. The method may further include annealing the semiconductor wafer. The method may also include focusing a laser beam through the back side of the semiconductor wafer into an interior portion of the wafer comprising the implanted dopant ions and scanning the laser beam along paths for boundaries between portions of the semiconductor wafer to form a modified layer in the interior of the wafer in the paths. The method may further include forming cracks in the semiconductor wafer from the modified layer in the paths. The method may also include separating the semiconductor wafer into the portions along the cracks.

Figure 11:
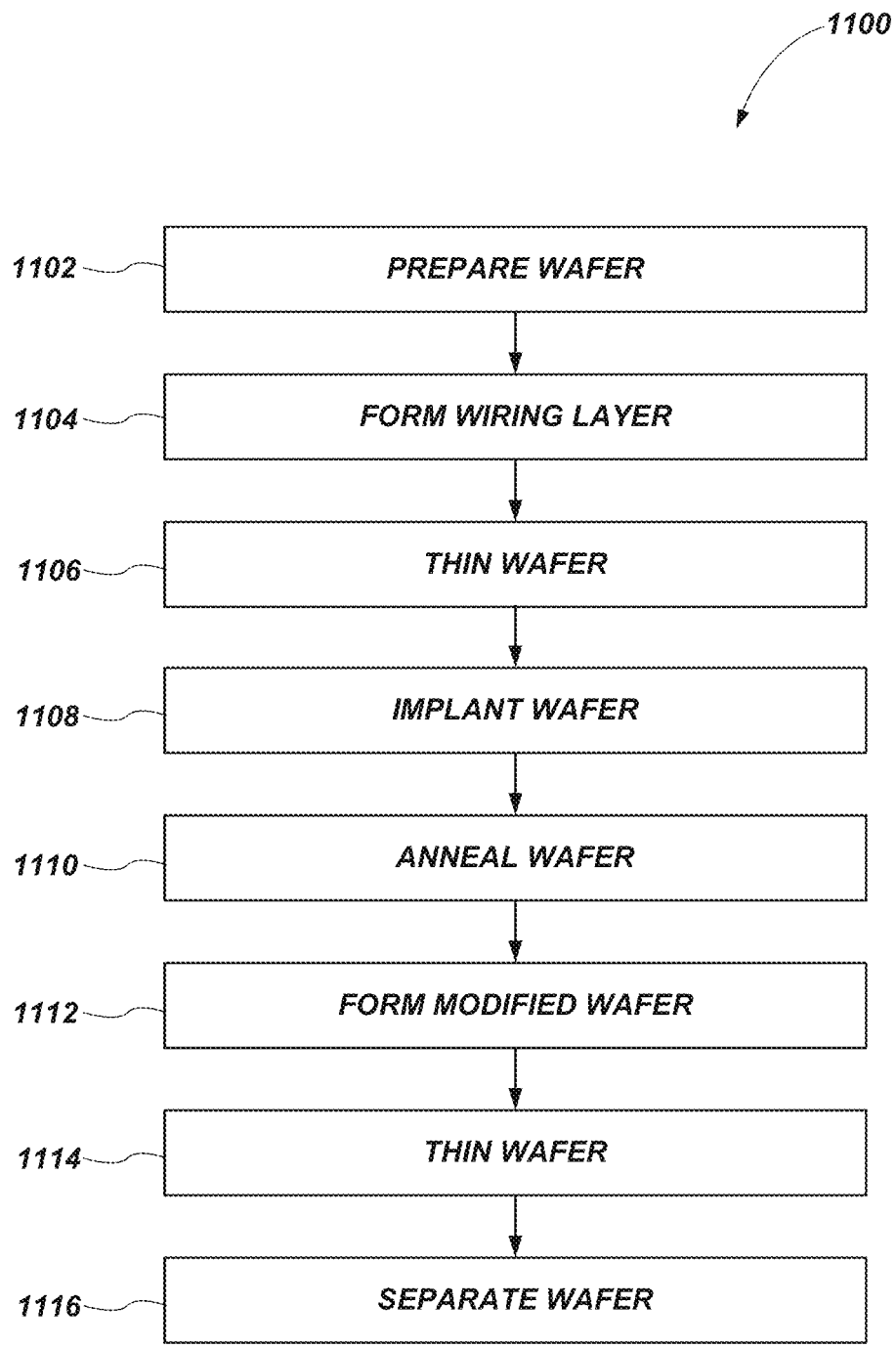
FIG. 11 illustrates a flow chart representative of a method of fabricating microelectronic devices in accordance with an embodiment of the present disclosure.

FIG. 11 illustrates a flow chart representative of an SDBG process 1100. Also referring to FIGS. 1A-10B. The wafer 102 may first be prepared for processing in act 1102. The wafer 102 may serve as a workpiece for fabrication of multiple microelectronic devices. The microelectronic devices may be fabricated on an active surface 106 of the wafer, as illustrated in act 1104. Fabricating the microelectronic devices may include applying one or more insulating layers, beneath, between and over conductive elements and components. Discontinuities between integrated circuitry of adjacent microelectronic device locations may define streets (e.g., separation regions, scribe lines, etc.) between the microelectronic devices on the wafer 102. The streets may be substantially free from features of the microelectronic devices. In some embodiments, the streets may include testing connections configured to enable a connection between testing equipment and the wiring layer through an end of each microelectronic device after the microelectronic devices are separated from the wafer.

After the microelectronic devices are fabricated on the active surface of the wafer a protective material may be applied over the microelectronic devices. The protective material may be a protective tape, a protective layer, etc. The protective material may be configured to protect the active surface of the wafer and integrated circuitry of the microelectronic devices from environmental and physical hazards within the microelectronic device manufacturing operation. For example, the protective material may protect the microelectronic devices from damage when coming into contact with tooling. In some embodiments, chemicals, vapors, lighting, lasers, etc., that may be used in the microelectronic device fabrication operation may be harmful to the one or more components of the microelectronic devices. The protective layer may provide an intermediary layer between the microelectronic devices and the surrounding environment to protect the microelectronic devices from any potentially harmful chemicals, vapors, lighting, lasers, etc. In some embodiments, debris, contaminants, and/or particulates may be in the air, such as particulates resulting from another process. The protective layer may prevent contamination of the microelectronic devices from any debris, contaminants, and/or particulates.

After the protective material is applied over the microelectronic devices, the wafer 102 may be inverted and thinned in act 1106. The wafer 102 may be secured to a tool on the active side of the wafer 102 such that the wafer 102 may be thinned from the back side 206 of the wafer 102. The thinning process may include mechanical material removal, such as grinding and/or polishing. In some embodiments, the thinning process may include a chemical material removal process such as an etching process or a combination of chemical and mechanical removal, as in so-called chemical mechanical planarization (CMP). The wafer 102 may be thinned to between about 50 µm and about 300 µm, such as between about 100 µm and about 200 µm. In some embodiments, the wafer 102 may be thinned in act 1106 to a final thickness. In some embodiments, the wafer 102 may be thinned in act 1106 only to an intermediate thickness. The intermediate thickness may be configured to enable a subsequent implantation process to penetrate to a desired depth in the wafer 102 relative to the active surface 106 of the wafer 102. For example, a subsequent SDBG process may be designed and implemented to form a modified layer at a specified depth from the active surface 106 of the wafer 102. The dopant ion implantation process may be configured to penetrate to substantially the same depth. As described above, penetrating to greater depths through the implantation process may require increasing the implantation energy of the dopant ions 404. Accordingly, some implantation depths may be difficult to obtain through the implantation process due to the amount of energy required to cause the dopant ions 404 to penetrate through the wafer 102. Thus, the wafer 102 may be thinned to a thickness that may enable the dopant ions 404 to penetrate to the specified depth without requiring an excessive amount of implantation energy.

After the wafer 102 is thinned in act 1106, the dopant ions 404 may be implanted into the wafer 102 in act 1108. The dopant ions 404 may be implanted from the back side 206 of the wafer 102. As discussed above, the desired penetration depth may be defined by the desired depth of the modified layer. The penetration depth of the dopant ions 404 may be defined by an implantation energy imparted to the dopant ions 404 in the implantation process. In some embodiments, a concentration of the dopant ions 404 implanted in the wafer 102 may be controlled. For example, the dopant ions 404 may be implanted at a higher concentration at a first depth and a lower concentration at a second depth. The first depth with the higher concentration may be at substantially the same depth as the desired depth of the modified layer. Regions of the wafer 102 with higher concentrations of implanted dopant ions 404 may exhibit increased energy absorption properties, as discussed above. Increasing the energy absorption properties of specific regions of a wafer 102 may reduce the amount of energy that can undesirably pass through those regions of the wafer 102, including energy from a laser beam used in an SDBG process.

After the dopant ions 404 are implanted into the wafer 102, the wafer 102 may be annealed in act 1110. The annealing process may include maintaining the wafer 102 at a temperature above ambient for a specific amount of time. For example, the temperature of the wafer 102 may be raised to between about 100 degrees C. and about 300 degrees C. In some embodiments, the annealing process may be completed in a furnace or oven. The wafer 102 may be maintained at the high temperature for an hour or more in a furnace, such as between about 1 hour to about 3 hours. In some embodiments, the annealing process may include a process such as Rapid Thermal Anneal (RTA) or Rapid Thermal Processing (RTP), which may complete the annealing process in less than an hour, such as between about 1 minute and about 30 minutes.

After the wafer 102 is implanted with dopant ions and annealed, a modified layer may be formed inside the wafer 102 in act 1112. The modified layer may be formed by a laser. For example, a laser beam 602 may be focused on an interior portion of the wafer 102 at a selected depth from the back side 206 thereof. In some embodiments, the laser beam 602 may locally melt the wafer 102 in the location where the laser beam 602 is focused, creating a weakened region of the wafer 102. The laser beam 602 may pass through the back side 206 of the wafer opposite the active surface of the wafer 102. The laser beam 602 may be focused within a region of the wafer 102 having a higher carrier concentration. The higher carrier concentration may increase the energy absorption properties of the wafer 102 such that the energy of the laser beam 602 is substantially absorbed by the wafer 102 in the modified layer. As described above, the dopant ion implantation process of act 1108 may create multiple regions of varying carrier concentrations. In some embodiments, the laser beam 602 may pass through regions of intermediate carrier concentrations and be focused in a region having the highest carrier concentration. The regions of intermediate carrier concentrations and the region of the highest carrier concentration may substantially absorb the energy of the laser beam 602 such that substantially all of the energy of the laser beam 602 is absorbed by the regions having elevated carrier concentration. Absorbing the energy of the laser beam 602 within the regions of elevated carrier concentration may substantially prevent the energy of the laser beam 602 from passing through the entire wafer 102 and reaching the microelectronic devices on the active surface 106 of the wafer 102.

A path of the modified layer may be substantially aligned with the streets between the microelectronic devices. The modified layer may be located a distance from the active surface of the wafer, which, in some embodiments may be substantially equal to the final desired thickness of the microelectronic devices. Thus, the modified layer may be configured to serve as a starting point for a separation crack between the microelectronic devices.

After the modified layer is formed in act 1112, material may be removed from the back side of the wafer in act 1114. The material may be removed until the wafer 102 reaches a desired final thickness of the wafer 102 desired to provide support for the microelectronic devices and isolation from the back side 206 of wafer 102. The desired thickness may be between about 20 microns and about 100 microns. The desired thickness may depend on the type of microelectronic device. For example, the desired thickness of some microelectronic devices may be between about 40 microns and about 100 microns, such as between about 40 microns and about 75 microns. In some embodiments, the desired thickness may be between about 20 microns and about 40 microns, such as between about 30 microns and about 35 microns or between about 20 microns and about 25 microns.

The wafer material may be removed through a material removal process such as back grinding or polishing (e.g., CMP). As the material is removed stresses inherent in the removal process may be greater in the weakened region around the modified layer such that a crack may be caused to originate at the modified layer and extend through the wafer and between the microelectronic devices along the streets.

After the wafer is thinned to the desired thickness of the microelectronic devices, a die attach film may be applied to the back side of the wafer and the protective material may be removed from the microelectronic devices.

The wafer may be coupled to a die separation tool in act 1116. The die separation tool may be coupled to the die attach film. In some embodiments, the die separation tool may be a cooled tool, such as a cold chuck or cold table configured to cool the wafer to a desired temperature. The desired temperature of the wafer may be a temperature where low k dielectric materials on the wafer become brittle. The die separation tool may be maintained at a temperature below the desired temperature of the wafer.

The die separation tool may be configured to apply an outward radial force to the die attach film to stretch the die attach film such that the individual microelectronic devices of the wafer become separated from one another along the cracks that propagated through the wafer in response to the material removal process in act 1114, after which the adhesion of the die attach film may be weakened to facilitate removal of the microelectronic devices by application of UV radiation or heat, depending on the die attach film.

Some embodiments of the present disclosure may include a microelectronic device. The microelectronic device may include a substrate of semiconductor material. The microelectronic device may further include integrated circuitry on an active surface of the substrate. The microelectronic device may also include dopant ions in the semiconductor material between the active surface and an opposing, back-side of the substrate.

Figure 12:
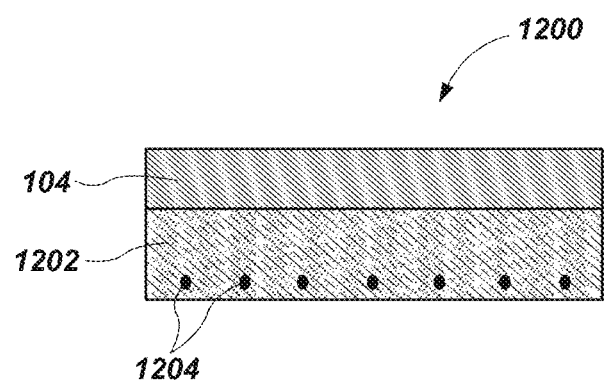
FIG. 12 illustrates a schematic view of a microelectronic device according to an embodiment of the present disclosure.

FIG. 12 illustrates an embodiment of a microelectronic device 1200 formed through the method described above. Referring also to FIGS. 1A-11. The microelectronic device 1200 may include circuitry layers 104 over semiconductor material 1202. The semiconductor material 1202 may be the material of the wafer 102 after the wafer 102 is thinned and singulated as described above. The semiconductor material 1202 may include residual dopant ions 1204 imbedded in the semiconductor material 1202 from the implantation process 400 or 1002 described above. In some embodiments, the wafer 102 may be thinned such that at least a portion of one or more of the first absorption zone 502, the second absorption zone 1012, and/or the first absorption zone 1010 remain including the residual dopant ions 1204 present in the respective zones. In some embodiments, the residual dopant ions 1204 may be dopant ions 404 that travelled beyond the respective implantation zone 402, first implantation zone 1004, second implantation zone 1006, etc. For example, some of the dopant ions 404 may receive a greater amount of energy or encounter fewer obstacles such that the dopant ions 404 travel beyond the intended implantation zone. The residual dopant ions 1204 may be the dopant ions 404 that traveled beyond the intended implantation zones and into the zone nearest the active surface 106 of the wafer 102. Thus, after the thinning processes some of the residual dopant ions 1204 may remain in the semiconductor material 1202 of the microelectronic device 1200. The microelectronic device 1200 may include memory devices, processors, signal processing devices, input devices, output devices, sensing devices, etc.

Some embodiments of the present disclosure may include an electronic system. The electronic system may include at least one microelectronic device. The microelectronic device may include a semiconductor layer comprising an active side, a back side, and dopant ions embedded in the semiconductor layer in a region proximate the back side of the semiconductor layer. The microelectronic device may further include an integrated circuitry layer over the active side of the semiconductor layer.

Figure 13:
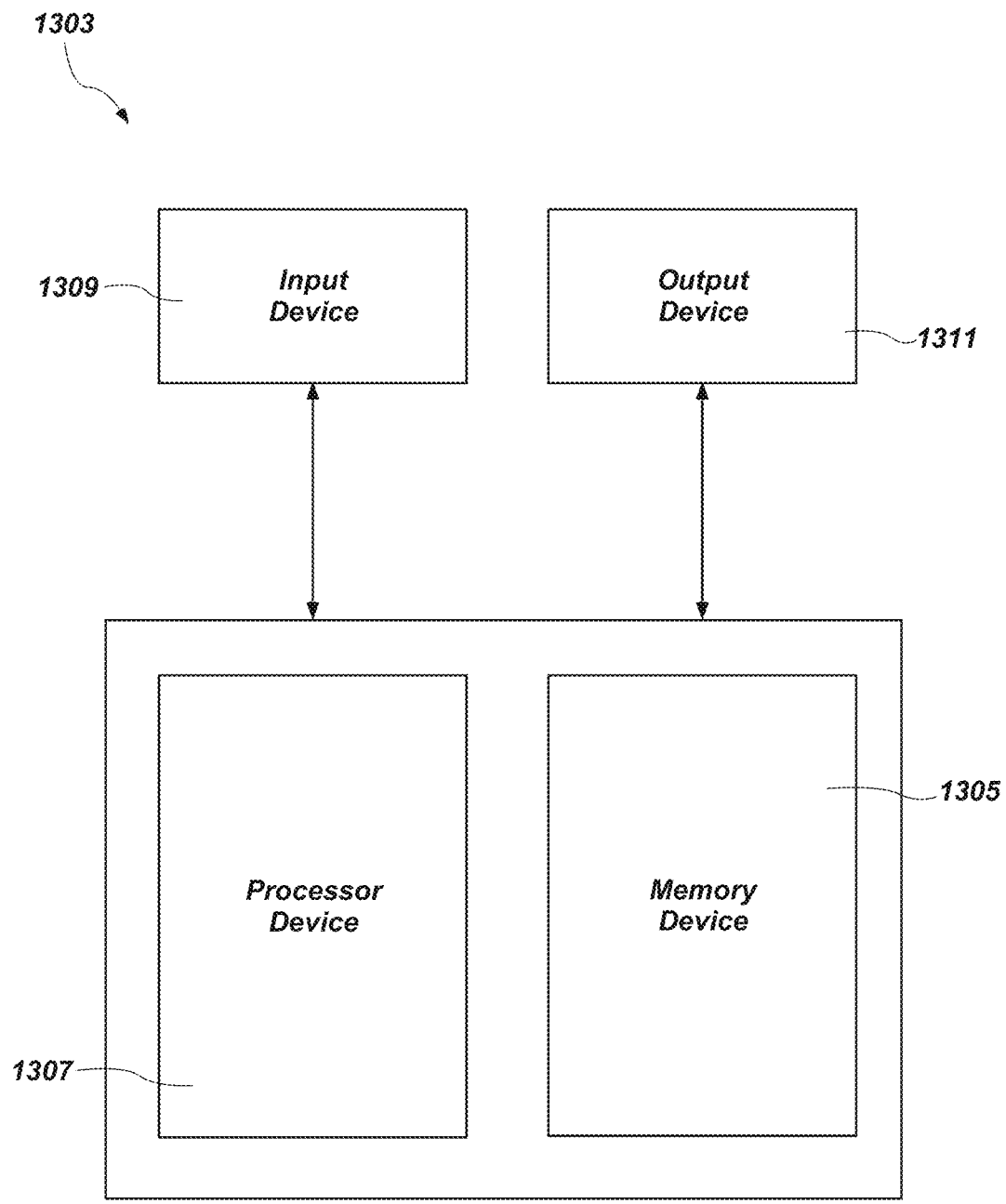
FIGS. 13 and 14 illustrate system diagrams in accordance with an embodiment of the present disclosure.

Microelectronic devices formed according to the embodiments of the present disclosure may be used in embodiments of electronic systems of the disclosure. For example, FIG. 13 is a block diagram of an electronic system 1303, in accordance with embodiments of the disclosure. The electronic system 1303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 1303 includes at least one memory device 1305. The at least one memory device 1305 may include, for example, one or more microelectronic devices according to embodiments of the disclosure.

The electronic system 1303 may further include at least one electronic signal processor device 1307 (often referred to as a "microprocessor"). The electronic signal processor device 1307 may include one or more microelectronic devices according to embodiments of the disclosure. The electronic system 1303 may further include one or more input devices 1309 for inputting information into the electronic system 1303 by a user, such as, for example, a mouse or other pointing device, a keyboard, a touchpad, a button, or a control panel. The electronic system 1303 may further include one or more output devices 1311 for outputting information (e.g., visual or audio output) to a user such as, for example, a monitor, a display, a printer, an audio output jack, a speaker, etc. In some embodiments, the input device 1309 and the output device 1311 may comprise a single touchscreen device that can be used both to input information to the electronic system 1303 and to output visual information to a user. The input device 1309 and the output device 1311 may communicate electrically with one or more of the memory devices 1305 and the electronic signal processor device 1307. At least some of the foregoing devices may be mounted to a one or more substrates, for example an interposer, a motherboard or other circuit board.

Figure 14:
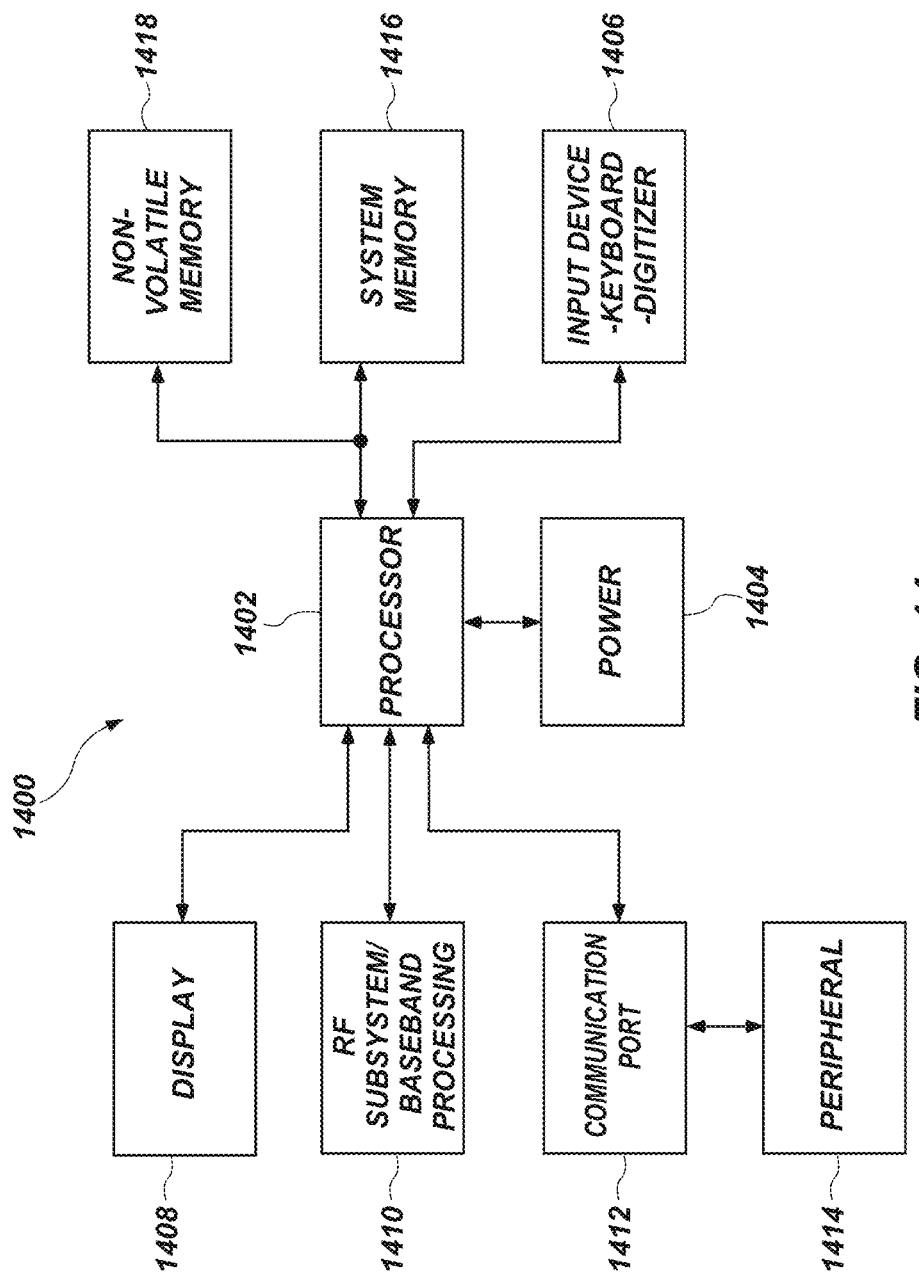

With reference to FIG. 14, depicted is a processor-based system 1400. The processor-based system 1400 may include various microelectronic components including microelectronic devices according to embodiments of the disclosure. The processor-based system 1400 may be any of a variety of types such as a computer, pager, cellular phone, personal organizer, control circuit, or other electronic device. The processor-based system 1400 may include one or more processors 1402, such as a microprocessor, to control the processing of system functions and requests in the processor-based system 1400. The processor 1402 as well as some or all other subcomponents of the processor-based system 1400 may include one or more microelectronic devices according to embodiments of the disclosure.

The processor-based system 1400 may include a power supply 1404 in operable communication with the processor 1402. For example, if the processor-based system 1400 is a portable system, the power supply 1404 may include one or more of a fuel cell, a power scavenging device, permanent batteries, replaceable batteries, and rechargeable batteries. The power supply 1404 may also include an AC adapter; therefore, the processor-based system 1400 may be plugged into a wall outlet, for example. The power supply 1404 may also include a DC adapter such that the processor-based system 1400 may be plugged into a vehicle cigarette lighter or a vehicle power port, for example.

Various other components may be coupled to the processor 1402 depending on the functions that the processor-based system 1400 performs. For example, a user interface 1406 may be coupled to the processor 1402. The user interface 1406 may include input devices such as buttons, switches, a keyboard, a light pen, a mouse, a digitizer and stylus, a touch screen, a voice recognition system, a microphone, or a combination thereof. A display 1408 may also be coupled to the processor 1402. The display 1408 may include an LCD display, an SED display, a CRT display, a DLP display, a plasma display, an OLED display, an LED display, a three-dimensional projection, an audio display, or a combination thereof. Furthermore, an RF sub-system/baseband processor 1410 may also be coupled to the processor 1402. The RF sub-system/baseband processor 1410 may include an antenna that is coupled to an RF receiver and to an RF transmitter (not shown). A communication port 1412, or more than one communication port 1412, may also be coupled to the processor 1402. The communication port 1412 may be adapted to be coupled to one or more peripheral devices 1414, such as a modem, a printer, a computer, a scanner, or a camera, or to a network, such as a local area network, remote area network, intranet, or the Internet, for example.

The processor 1402 may control the processor-based system 1400 by implementing software programs stored in the memory. The software programs may include an operating system, database software, drafting software, word processing software, media editing software, or media playing software, for example. The memory is operably coupled to the processor 1402 to store and facilitate execution of various programs. For example, the processor 1402 may be coupled to system memory 1416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1416 may include volatile memory, non-volatile memory, or a combination thereof. The system memory 1416 is typically large so that it can store dynamically loaded applications and data. In some embodiments, the system memory 1416 may include one or more microelectronic components including microelectronic devices according to embodiments of the disclosure.

The processor 1402 may also be coupled to non-volatile memory 1418, which is not to suggest that system memory 1416 is necessarily volatile. The non-volatile memory 1418 may include one or more of STT-MRAM, MRAM, read-only memory (ROM) such as an EPROM, resistive read-only memory (RROM), and flash memory to be used in conjunction with the system memory 1416. The size of the non-volatile memory 1418 is typically selected to be just large enough to store any necessary operating system, application programs, and fixed data. Additionally, the non-volatile memory 1418 may include a high-capacity memory such as disk drive memory, such as a hybrid-drive including resistive memory or other types of non-volatile solid-state memory, for example. The non-volatile memory 1418 may include microelectronic components including microelectronic devices according to embodiments of the disclosure.

The embodiments of the present disclosure may enable a microelectronic device manufacturing operation to form thin microelectronic devices, while maintaining a die strength of the microelectronic devices and reducing failures in the microelectronic devices. Thinner microelectronic devices may enable downstream products utilizing the microelectronic devices to be smaller and/or thinner. Reducing failures in the microelectronic devices may reduce losses due to waste. Moreover, reducing failures may increase reliability of the microelectronic devices and downstream devices by reducing the number of early failures of the microelectronic devices.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A system for performing a stealth dicing process, the system comprising:
a doping apparatus configured to implant a first concentration of dopant ions to a first depth in an interior of a semiconductor wafer and a second concentration of dopant ions to a second depth in the semiconductor wafer through the back surface thereof;
a laser configured to focus a laser beam at a third depth between the first depth and the second depth in an interior portion of the wafer and form a weakened region in material of a semiconductor wafer;
a material removal tool configured to remove material from the semiconductor wafer to at least the second depth, wherein the material removal tool comprises a mechanical material removal tool; and
the doping apparatus, the laser and the material removal tool each positioned, in operation, on a same, back side of an in-process semiconductor wafer.

2. The system of claim 1, further comprising a heating device configured and positionable to anneal a semiconductor wafer.

3. The system of claim 1, wherein the doping apparatus is configured to implant dopant ions at more than one energy.

4. The system of claim 3, wherein the doping apparatus is configured to implant a higher concentration of dopant ions at the first depth and a lower concentration of ions at the second depth.

5. The system of claim 4, wherein the first depth is a greater depth than the second depth.

6. The system of claim 5, wherein the laser is configured to cause the laser beam to pass through the lower concentration of ions at the second depth.

7. The system of claim 1, wherein the mechanical material removal tool comprises at least one of a grinding tool or a polishing tool.

8. The system of claim 1, wherein the mechanical material removal tool is configured and positioned to remove material from the semiconductor wafer after the laser focuses the laser beam at the third depth.

9. The system of claim 1, wherein the doping apparatus is configured to accelerate the dopant ions to energies in a range from about 10 keV to about 1000 keV.

* * * * *